United States Patent
Xu et al.

(10) Patent No.: US 9,252,059 B2
(45) Date of Patent: Feb. 2, 2016

(54) METHOD FOR MANUFACTURING SEMICONDUCTOR DEVICE

(71) Applicant: Institute of Microelectronics, Chinese Academy of Sciences, Beijing (CN)

(72) Inventors: Qiuxia Xu, Beijing (CN); Gaobo Xu, Beijing (CN); Huajie Zhou, Beijing (CN); Huilong Zhu, Poughkeepsie, NY (US); Dapeng Chen, Beijing (CN)

(73) Assignee: Institute of Microelectronics, Chinese Academy of Sciences (CN)

( * ) Notice: Subject to any disclaimer, the term of this patent is extended or adjusted under 35 U.S.C. 154(b) by 0 days.

(21) Appl. No.: 14/233,280

(22) PCT Filed: Dec. 7, 2012

(86) PCT No.: PCT/CN2012/086132
§ 371 (c)(1),
(2) Date: Jan. 16, 2014

(87) PCT Pub. No.: WO2014/082338
PCT Pub. Date: Jun. 5, 2014

(65) Prior Publication Data
US 2015/0262887 A1    Sep. 17, 2015

(30) Foreign Application Priority Data
Nov. 30, 2012  (CN) .......................... 2012 1 0507230

(51) Int. Cl.
*H01L 21/8238*  (2006.01)
*H01L 29/49*  (2006.01)
(Continued)

(52) U.S. Cl.
CPC .... *H01L 21/823857* (2013.01); *H01L 21/0206* (2013.01); *H01L 21/02301* (2013.01);
(Continued)

(58) Field of Classification Search
None
See application file for complete search history.

(56) References Cited

U.S. PATENT DOCUMENTS

2005/0224897 A1* 10/2005 Chen et al. .................... 257/410
2008/0224225 A1*  9/2008 Ko et al. ........................ 257/369
(Continued)

FOREIGN PATENT DOCUMENTS

CN      101447454 A     6/2009
CN      101800196 A     8/2010
(Continued)

OTHER PUBLICATIONS

"International Application Serial No. PCT/CN2012/086132, International Search Report and Written Opinion mailed Aug. 29, 2013", 11 pgs.

*Primary Examiner* — Michael Lebentritt
*Assistant Examiner* — Jordan Klein
(74) *Attorney, Agent, or Firm* — Schwegman Lundberg & Woessner, P.A.

(57) ABSTRACT

A method for manufacturing a semiconductor device that comprises two opposite types of MOSFETs formed on one semiconductor substrate, comprising: defining an active region for each of the MOSFETs on the semiconductor substrate; forming an interfacial oxide layer on a surface of the semiconductor substrate; forming a high-K gate dielectric layer on the interfacial oxide layer; forming a metal gate layer on the high-K gate dielectric layer; implanting dopant ions in the metal gate layer; forming a Poly-Si layer on the metal gate layer; patterning the Poly-Si layer, the metal gate layer, the high-K gate dielectric layer and the interfacial oxide layer to form a plurality of gate stack structures; forming a plurality of gate spacer surrounding each of the plurality of gate stack structures; and forming a plurality of S/D regions. During activation annealing for forming the S/D regions, the dopant ions implanted in the metal gate layer diffuse and accumulate at an upper interface of the high-K gate dielectric layer to change the characteristics of the metal gates, and at a lower interface of the high-K gate dielectric layer to form electric dipoles with appropriate polarities by interfacial reaction, so as to realize adjusting of the effective work functions of the metal gates of the opposite types of MOSFETs, respectively.

21 Claims, 4 Drawing Sheets

(51) Int. Cl.
| | |
|---|---|
| H01L 21/28 | (2006.01) |
| H01L 21/285 | (2006.01) |
| H01L 21/265 | (2006.01) |
| H01L 21/268 | (2006.01) |
| H01L 21/3213 | (2006.01) |
| H01L 21/324 | (2006.01) |
| H01L 29/423 | (2006.01) |
| H01L 29/10 | (2006.01) |
| H01L 29/66 | (2006.01) |
| H01L 21/02 | (2006.01) |
| H01L 29/51 | (2006.01) |

(52) U.S. Cl.
CPC ........ *H01L21/02304* (2013.01); *H01L 21/265* (2013.01); *H01L 21/268* (2013.01); *H01L 21/28088* (2013.01); *H01L 21/28176* (2013.01); *H01L 21/28185* (2013.01); *H01L 21/28194* (2013.01); *H01L 21/28568* (2013.01); *H01L 21/324* (2013.01); *H01L 21/32139* (2013.01); *H01L 21/823814* (2013.01); *H01L 21/823842* (2013.01); *H01L 29/1066* (2013.01); *H01L 29/42364* (2013.01); *H01L 29/4916* (2013.01); *H01L 29/4966* (2013.01); *H01L 29/517* (2013.01); *H01L 29/66477* (2013.01); *H01L 29/66575* (2013.01); *H01L 29/513* (2013.01); *H01L 29/665* (2013.01)

(56) References Cited

U.S. PATENT DOCUMENTS

| | | | | |
|---|---|---|---|---|
| 2010/0133623 | A1* | 6/2010 | Inumiya et al. | 257/369 |
| 2010/0244141 | A1* | 9/2010 | Beyer et al. | 257/369 |
| 2011/0049642 | A1* | 3/2011 | Scheiper et al. | 257/392 |
| 2011/0287620 | A1* | 11/2011 | Xu et al. | 438/591 |
| 2012/0021596 | A1* | 1/2012 | Han et al. | 438/591 |
| 2012/0094447 | A1* | 4/2012 | Xu et al. | 438/216 |
| 2012/0282748 | A1* | 11/2012 | Xu et al. | 438/287 |
| 2012/0292711 | A1* | 11/2012 | Zhao et al. | 257/369 |
| 2013/0099328 | A1* | 4/2013 | Xu et al. | 257/411 |

FOREIGN PATENT DOCUMENTS

| | | | |
|---|---|---|---|
| CN | 101800196 A | * | 8/2010 |
| CN | 102339858 A | | 2/2012 |
| CN | 102339858 A | * | 2/2012 |

* cited by examiner

METHOD FOR MANUFACTURING SEMICONDUCTOR DEVICE

PRIORITY

This application is a National Phase application of, and claims priority to, PCT Application No. PCT/CN2012/086132, filed on Dec. 7, 2012, entitled "METHOD FOR MANUFACTURING SEMICONDUCTOR DEVICE", which claimed priority to Chinese Application No. 201210507230.8, filed on Nov. 30, 2012. Both the PCT Application and Chinese Application are incorporated herein by reference in their entireties.

TECHNICAL FIELD

The present disclosure relates to semiconductor technology, and particularly to a method for manufacturing a semiconductor device comprising a metal gate and a high-K gate dielectric layer.

BACKGROUND

As the development of semiconductor technology, feature sizes of metal-oxide-semiconductor-field-effect transistors (MOSFETs) decrease continuously. The size decreasing of the MOSFETs causes a severe problem of gate current leakage. The gate leakage current can be reduced by using a high-K gate dielectric layer, which may have an increased physical thickness with a constant equivalent oxide thickness (EOT). However, conventional Poly-Si gate is incompatible with the high-K gate dielectric layer. The combination of a metal gate and the high-K gate dielectric layer can not only avoid the exhaustion effect of the Poly-Si gate and decrease gate resistance, but also avoid penetration of boron and enhance device reliability. Therefore, the combination of the metal gate and the high-K gate dielectric layer is widely used in the MOSFETs of 45 nm and below generation. However, there are still many challenges in the integration of the metal gate with the high-K dielectric such as thermal stability and interface state. Particularly, due to Fermi-Pinning Effect, it is difficult for the MOSEFT using the metal gate and the high-K dielectric layer to have an appropriately low threshold voltage.

In a CMOS device integrating an N-type MOSFET (NMOSFET) and a P-type MOSFET (PMOSFET), to obtain appropriate threshold voltages, the NMOSFET should have an effective work function near the bottom of the conduction band of Si (about 4.1 eV), while the PMOSFET should have an effective work function near the top of the valence band of Si (about 5.2 eV). Different combinations of the metal gate and the high-K dielectric layer may be selected respectively for the NMOSFET and PMOSFET, so as to realize required threshold voltages. As a result, dual metal gates and dual high-K dielectric layers need to be formed in one chip. During manufacture of the CMOS device, photolithography and etching steps for the metal gates and the high-K dielectric layers are performed respectively for the NMOSFET and the PMOSFET. Therefore, the method for manufacturing semiconductor devices comprising the dual metal gates and the dual gate dielectric layers is complicated and thus is not suitable for mass production, which further leads to high cost.

SUMMARY

The present disclosure intends to provide a method for manufacturing a semiconductor device, by which it is possible to adjust effective work functions of the semiconductor device during manufacturing process thereof.

The present disclosure provides a method for manufacturing a semiconductor device that comprises two opposite types of MOSFETs formed on one semiconductor substrate, comprising: defining an active region for each of the MOSFETs on the semiconductor substrate; forming an interfacial oxide layer on a surface of the semiconductor substrate; forming a high-K gate dielectric layer on the interfacial oxide layer; forming a metal gate layer on the high-K gate dielectric layer; implanting dopant ions in the metal gate layer, that is an N-type dopant is implanted into the metal gate layer of the active region of the N-type MOSFET, and a P-type dopant is implanted into the metal gate layer of the active region of the P-type MOSFET; forming a Poly-Si layer on the metal gate layer; patterning the Poly-Si layer, the metal gate layer, the high-K gate dielectric layer and the interfacial oxide layer to form a plurality of gate stack structures; forming a plurality of gate spacers surrounding each of the gate stack structures; and forming a plurality of S/D regions, wherein during activation annealing for forming the S/D regions, the dopant ions in the metal gate layer diffuse and accumulate at an upper interface between the high-K gate dielectric layer and the metal gate layer and at a lower interface between the high-K gate dielectric layer and the interfacial oxide layer, and electric dipoles are generated by interfacial reaction at the lower interface between the high-K gate dielectric layer and the interfacial oxide layer.

In this method, in one aspect, the dopant ions accumulated at the upper interface of the high-K gate dielectric layer change the characteristics of the metal gates, thereby adjusting the effective work function of the corresponding MOSFET advantageously. In a further aspect, the dopant ions accumulated at the lower interface of the high-K gate dielectric layers form the electric dipoles with appropriate polarities by the interfacial reaction, thereby further adjusting the effective work function of the corresponding MOSFET advantageously. The semiconductor device fabricated by this method has good stability and significant effect of adjusting the effective work function of the metal gate Different dopants may be selected for the two types of MOSFETs to decrease or increase the effective work functions. In complementary metal-oxide-semiconductor (CMOS) devices, threshold voltages of the two types of MOSFETs can be adjusted respectively simply by changing the dopants, instead of using different combinations of the metal gates and the gate dielectrics. Accordingly, this method can remove corresponding steps of deposition, mask and etching, so as to simplify the process and enable mass production.

BRIEF DESCRIPTION OF THE DRAWINGS

In order to provide a thorough understanding of the present disclosure, the present disclosure will be explained in detail based on the accompanying drawings.

DETAILED DESCRIPTION

Figure 1:
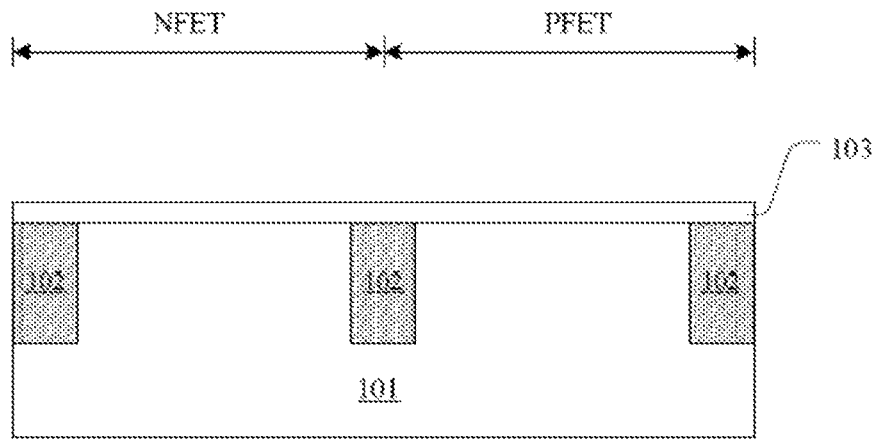
FIGS. 1-8 schematically show sectional views of respective semiconductor structures during each stage of manufacturing a semiconductor device according to an embodiment of the present disclosure.

Next, the present disclosure will be explained in detail with references to accompanying drawings. In the following description, similar parts are represented by the same or similar reference signs, regardless of whether they are shown in different embodiments. Respective parts in the drawings are not drawn to scale for the sake of clarity.

In the following description, numerous specific details are set forth, such as structures, materials, sizes and treatment processes and technologies of devices, in order to provide a thorough understanding of the present disclosure. However, it will be understood by those of ordinary skill in the art that the present invention may be practiced without these specific details. Each portion of the semiconductor device may consist of materials well known to those of ordinary skill in the art, or materials having similar function developed in future, unless noted otherwise.

In the present disclosure, the term "semiconductor structure" refers to a semiconductor substrate and all the layers or regions formed on the semiconductor substrate formed after corresponding steps of manufacturing a semiconductor device. The term "S/D region" refers to either one of a source region and a drain region of a MOSFET, and both of the source region and the drain region are labeled with a same reference sign. The term "N-type dopant" refers to a dopant applied to an NMOSFET and capable of decreasing effective work function. The term "P-type dopant" refers to a dopant applied to a PMOSFET and capable of increasing effective work function.

A method for manufacturing a semiconductor device according to gate first process will be illustrated with references to FIGS. 1-8, according to one embodiment of the present disclosure. The semiconductor device is a CMOS device comprising an NMOSFET and a PMOSFET formed on one semiconductor substrate.

The semiconductor structure as shown in FIG. 1 has gone through part of the gate first process. On a semiconductor substrate 101 (e.g., a Si substrate) there are provided an active region for the NMOSFET and an active area for the PMOSFET, separated by a shallow trench insulation 102.

An interfacial oxide layer 103 (e.g., a silicon oxide layer) is formed on an exposed surface of the semiconductor substrate 101 by chemical oxidation or additional thermal oxidation. In one embodiment, the interfacial oxide layer 103 is formed by rapid thermal oxidation within 20-120 seconds at a temperature of about 600-900° C. In another embodiment, the interfacial oxide layer 103 is formed by chemical oxidation in water solution containing ozone ($O_3$).

Preferably, the surface of the semiconductor substrate 101 may be cleaned before the interfacial oxidation layer 103 is formed. Cleansing the semiconductor substrate 101 may comprise cleaning the semiconductor substrate 101 normally and then immersing the semiconductor substrate 101 in mixed solution including hydrofluoric acid, isopropanol and water. After that, the semiconductor substrate 101 may be washed with deionized water, and then spin-dried. In one embodiment, the hydrofluoric acid, isopropanol and water in the mixed solution may have a volume ratio about 0.2-1.5%: 0.01-0.10%:1, and the time for immersing the semiconductor substrate 101 in the mixed solution is about 1-10 minutes. Cleaning the semiconductor substrate 101 can obtain a clean surface of the semiconductor substrate 101, inhibit particle pollution and generation of natural oxidation on the surface of silicon, and thus help to form the interfacial oxidation layer 103 with high quality.

Figure 2:
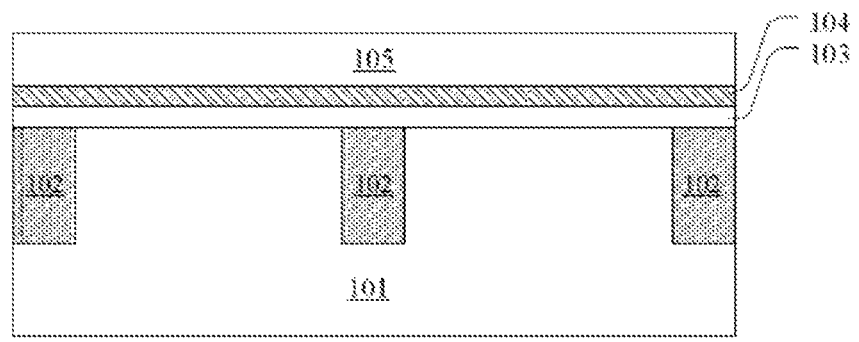

Then, by deposition processes, for example, ALD (atomic layer deposition), CVD (chemical vapor deposition), MOCVD (metal organic chemical vapor deposition), PVD (physical vapor deposition), sputtering and so on, a high-K gate dielectric layer 104 and a metal gate layer 105 may be formed on the surface of the semiconductor structure in sequence, as shown in FIG. 2.

The high-K gate dielectric layer 104 may comprise any appropriate material with a dielectric constant greater than that of $SiO_2$, such as any one selected from a group consisting of $ZrO_2$, ZrON, ZrSiON, HfZrO, HfZrON, HfON, $HfO_2$, HfAlO, HfAlON, HfSiO, HfSiON, HfLaO, HfLaON, and any combination thereof. The metal gate layer 105 may comprise any appropriate material capable of forming a metal gate, such as any one selected from a group consisting of TiN, TaN, MoN, WN, TaC, and TaCN, and any combination thereof. In one embodiment, the high-K gate dielectric layer 104 may be a $HfO_2$ layer having a thickness of about 1.5-5 nm, and the metal gate layer 105 may be a TiN layer having a thickness of about 2-30 nm, for example.

Preferably, post-deposition-annealing of the high-K gate dielectric layer may be performed between forming the high-K gate dielectric layer 104 and forming the metal gate layer 105, so as to improve the quality of the high-K dielectric layer, which benefits to obtain a uniform thickness of the metal gate layer 105 formed subsequently. In one embodiment, rapid thermal annealing at the temperature of 500-1000° C. within 5-100 seconds may be performed as the post-deposition-annealing.

Figure 3:
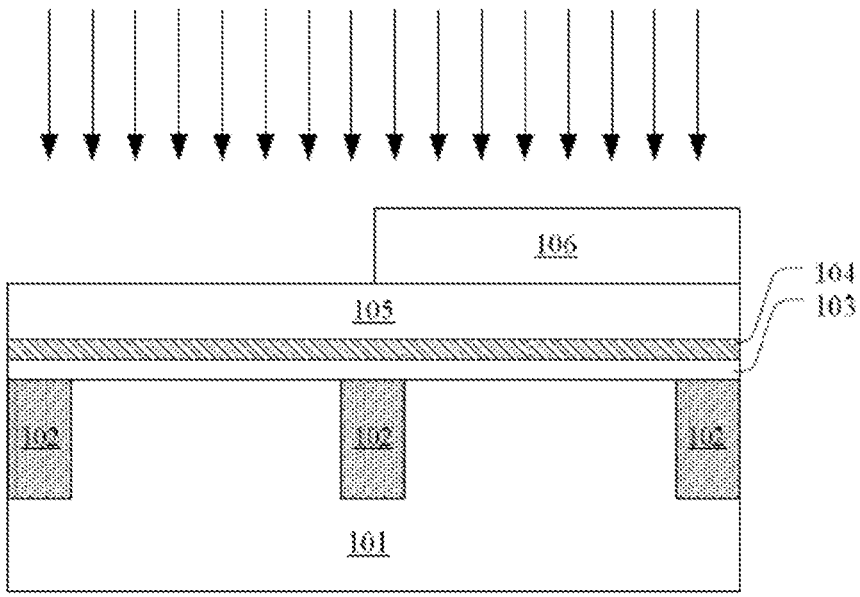

Then, by photolithography process including exposure and development, a patterned photoresist mask 106 is formed, so as to cover the active region of the PMOSFET and expose the active region of the NMOSFET. Ion implantation is performed using the photoresist mask 106 to implant N-type dopant in the metal gate layer 105 in the active region of the NMOSFET, as shown in FIG. 3. The N-type dopant for the metal gate may be any one selected from a group consisting of P, As, Sb, La, Er, Dy, Gd, Sc, Yb, Er and Tb. By controlling the energy and the dosage of the ion implantation, the implanted dopant ions only distribute in the metal gate layer 105 without entering the high-K gate dielectric layer 104. Moreover, by controlling the energy and the dosage of the ion implantation, the metal gate layer 105 can have an appropriate dopant depth and an appropriate dopant concentration, so that a desired threshold voltage can be obtained. In one embodiment, the energy of the ion implantation is about 0.2-30 KeV, the dosage of the ion implantation is about 1E13-1E15 $cm^{-2}$. The photoresist mask 106 is removed by ashing or dissolution after the aforementioned ion implantation.

Figure 4:
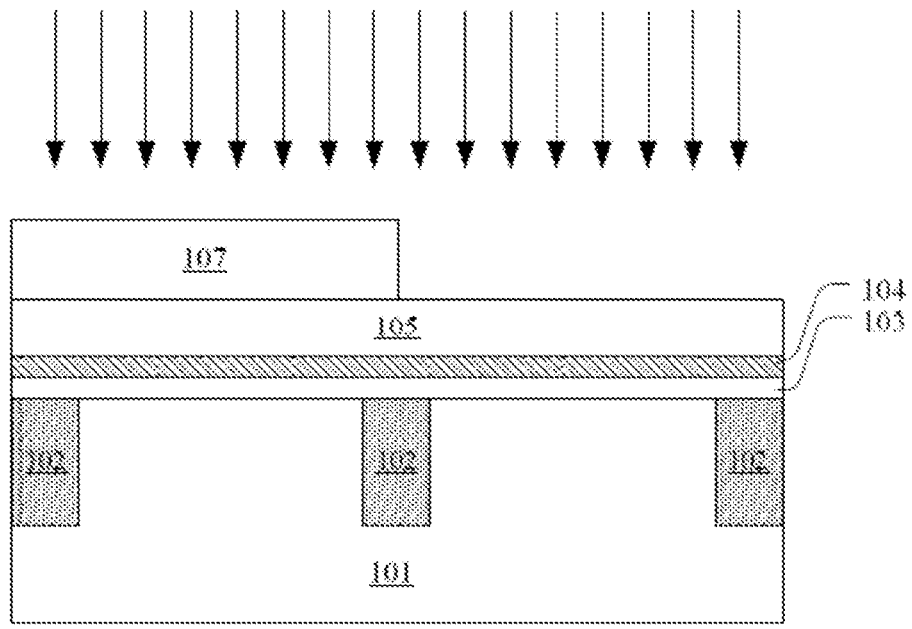

Then, by photolithography process including exposure and development, a patterned photoresist mask 107 is formed, so as to cover the active region of the NMOSFET and expose the active region of the PMOSFET. Ion implantation is performed using the photoresist mask 107 to implant P-type dopant in the metal gate layer 105 in the active region of the PMOSFET, as shown in FIG. 4. The P-type dopant for the metal gate can be any one selected from a group consisting of In, B, $BF_2$, Ru, W, Mo, Al, Ga and Pt. By controlling the energy and the dosage of the ion implantation, the implanted dopant ions only distribute in the metal gate layer 105 without entering the high-K gate dielectric layer 104, and the metal gate layer 105 may have an appropriate dopant depth and an appropriate dopant concentration, so that a desired threshold voltage can be obtained. In one embodiment, the energy of the ion implantation is about 0.2-30 KeV, the dosage of the ion implantation is about 1E13-1E15 $cm^{-2}$. The photoresist mask 107 is removed by ashing or dissolution after the aforementioned ion implantation.

Figure 5:
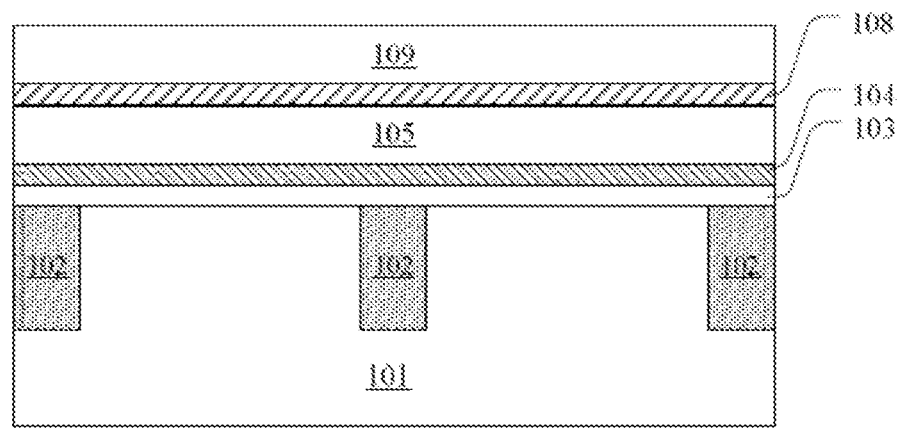

Then, by aforementioned deposition processes, a metal barrier layer 108 and a Poly-Si layer 109 are formed on the surface of metal gate layer of the semiconductor structure in sequence, as shown in FIG. 5. The metal barrier layer 108 may comprise any material capable of blocking reaction and inter-diffusion between the Poly-Si layer 109 and the metal gate layer 105, such as any one selected from a group consisting of TaN, AlN and TiN. It is to be noted that the metal barrier layer 108 is optional. The metal barrier layer 108 is not necessary if there is no reaction and interdiffusion between the Poly-Si layer 109 and the metal gate layer 105. In one embodiment, the metal barrier layer 108 may be, for example, a TaN layer having a thickness of about 3-8 nm, and the Poly-Si layer 109 may have a thickness of about 30-120 nm.

Figure 6:
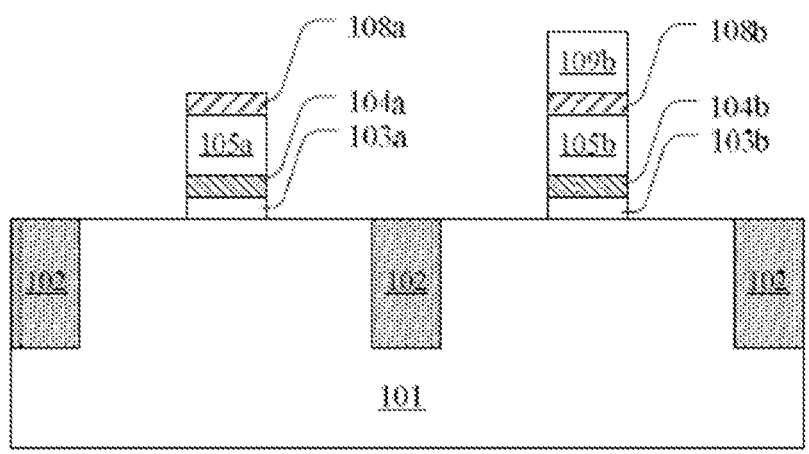

Then, a plurality of gate stack structures are formed by patterning using a photoresist mask (not shown) or a hard mask (not shown). During the patterning, exposure portions of the Poly-Si layer 109, the metal barrier layer 108, the metal gate layer 105, the high-K gate dielectric layer 104 and the interfacial oxide layer 103 are selectively removed by dry etching, such as ion-milling etching, plasma etching, reactive ion etching, or laser ablation, or by wet etching using etchant solution, so as to form the gate stack structures of the NMOSFET and the PMOSFET respectively, as shown in FIG. 6. The gate stack structure of the NMOSFET as shown in FIG. 6 comprises a Poly-Si gate 109a, a metal barrier layer 108a, a metal gate 105a, a high-K gate dielectric layer 104a and an interfacial oxide layer 103a. The gate stack structure of the PMOSFET as shown in FIG. 6 comprises a Poly-Si gate 109b, a metal barrier layer 108b, a metal gate 105b, a high-K gate dielectric layer 104b and an interfacial oxide layer 103b. Although the gate stack structures of the NMOSFET and the PMOSFET are formed by the same layers, the metal gates of the NMOSFET and the PMOSFET comprise opposite types of dopant ions, which perform opposite adjusting functions on the respective effective work functions. The aforementioned etching during patterning further exposes the surface of the semiconductor substrate 101.

During the patterning for forming the gate stack structures, different etchants may be applied to different layers. In one embodiment, etchant gas based on F, etchant gas based on Cl or etchant gas based on HBr/Cl$_2$ may be applied in dry etching of the Poly-Si layer 109. Etchant gas based on BCl$_3$/Cl$_2$ and BCl$_3$ may be applied in dry etching of the metal gate layer 105 and the high-K gate dielectric layer 104 respectively. Preferably, Ar and/or O$_2$ may be added into the aforementioned etchant gases to improve the etching effect. It is desirable that the gate stack structures have steep and continuous etching profiles, high anisotropy, and high etching selection ratio with respect to the silicon substrate in order to avoid any damage to the silicon substrate.

Figure 7:
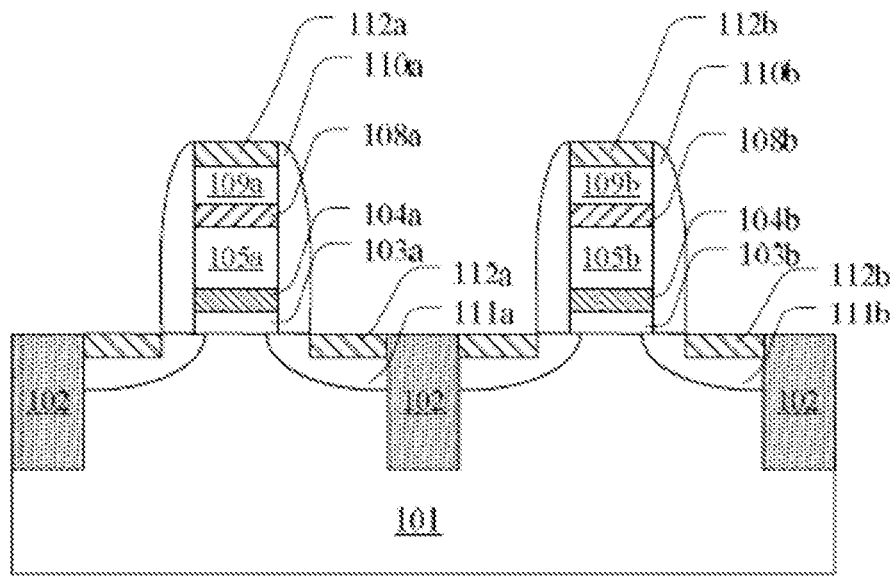
Figure 8:
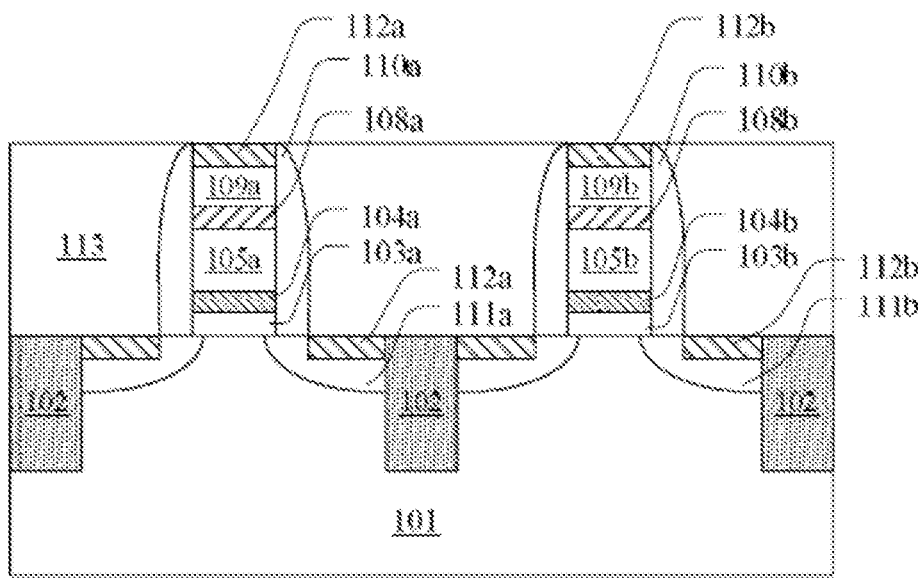

Then, by the aforementioned deposition processes, a silicon nitride layer having a thickness of about 10-50 nm may be formed on the surface of the semiconductor structure. Then, anisotropy etching may be performed to the silicon nitride layer, so that a spacer 110a surrounding the gate stack structure is formed in the active region of the NMOSFET, and a spacer 110b surrounding the gate stack structure is formed in the active region of the PMOSFET. The gate stack structures and the spacers thereof are used as hard masks to perform S/D ion implantation, and then activation annealing is performed. Therefore, S/D regions 111a of the NMOSFET and S/D regions 111b of the PMOSFET are formed in the semiconductor substrate 101, as shown in FIG. 7. The S/D regions 111a of the NMOSFET locate at both sides of the gate stack structure thereof, and may comprise extension regions at least partly extending to under the high-K gate dielectric layer 104a. The S/D regions 111b of the PMOSFET locate at both sides of the gate stack structure thereof, and may comprise extension regions at least partly extending to under the high-K gate dielectric layer 104b.

Rapid thermal annealing (RTA), spike annealing, laser annealing, and microwave annealing may be applied for the activation annealing of the S/D regions. The temperature for the annealing may be about 950-1100° C., and the time duration for the annealing may be about 2 ms-30 s. During activation annealing for forming the S/D regions, the dopant ions implanted in the metal gate layer diffuse and accumulate at an upper interface between the high-K gate dielectric layer and the metal gate layer and at an lower interface between the high-K gate dielectric layer and the interfacial oxidation layer, thereby forming stacking. In one aspect, the dopant ions accumulated at the upper interface of the high-K gate dielectric layers 104a and 104b change the characteristics of the metal gates, thereby adjusting the effective work functions of the corresponding MOSFETs advantageously. In a further aspect, the dopant ions accumulated at the lower interface of the high-K gate dielectric layers 104a and 104b form electric dipoles with appropriate polarities by interfacial reaction, thereby further adjusting the effective work functions of the corresponding MOSFETs advantageously. In this way, the effective work functions of the metal gates of the NMOSFET device and the PMOSFET device can be adjusted, respectively.

In addition, silicide regions 112a (e.g., nickel silicide, nickel platinum silicide) may be formed at the surface of the S/D regions 111a and the gate region 109a, so as to decrease series resistance and contact resistance of the S/D regions 111a and the gate region 109a. Silicide regions 112b (e.g., nickel silicide, nickel platinum silicide) may be formed at the surface of the S/D regions 111b and the gate region 109b, so as to decrease series resistance and contact resistance of the S/D regions 111b and the gate region 109b.

Then, by the aforementioned deposition processes, an interlayer dielectric layer 113 (e.g., a silicon nitride layer or a silicon oxide layer) covering the active regions may be formed on the surface of the semiconductor structure. By chemical-mechanical polishing (CMP), the surface of the interlayer dielectric layer 113 is smoothed, Then, contact formation and metallization well known in the art are performed.

Not every detail of the MOSFETs, such as formation of S/D contact, formation of additional interlayer dielectric layer and formation of conductive path, has been disclosed in the foregoing disclosure. Standard CMOS processes for forming the aforementioned portions are well known to those of ordinary skill in the art, and thus description thereof is omitted.

It should be noted that the foregoing only illustrates examples and describes the present disclosure, but not intends to exhaust and limit the present disclosure. Therefore, the present disclosure is not limited to the aforementioned embodiments. Any alternatives or modification obvious to those of ordinary skill in the art will fall within the scope of the present disclosure without departing from the spirit and principle thereof.

We claim:

1. A method for manufacturing a semiconductor device that comprises two opposite types of MOSFETs formed on one semiconductor substrate, comprising:
    defining an active region for each of the MOSFETs on the semiconductor substrate;
    forming an interfacial oxide layer on a surface of the semiconductor substrate;
    forming a high-K gate dielectric layer on the interfacial oxide layer;
    forming a metal gate layer on the high-K gate dielectric layer;
    implanting dopant ions in the metal gate layer;

forming a metal barrier layer on the metal gate layer between the step of implanting dopant ions and the step of forming a Poly-Si layer, wherein the metal barrier layer is arranged between the metal gate layer and the Poly-Si layer, wherein the metal barrier layer is any one selected from a group consisting of TaN, AlN and TiN;

forming the Poly-Si layer on the metal gate layer;

patterning the Poly-Si layer, the metal gate layer, the high-K gate dielectric layer and the interfacial oxide layer to form a plurality of gate stack structures;

forming a plurality of gate spacers surrounding each of the gate stack structures; and forming a plurality of S/D regions, wherein during activation annealing for forming the S/D regions, the dopant ions in the metal gate layer diffuse and accumulate at an upper interface between the high-K gate dielectric layer and the metal gate layer, which change the characteristics of the metal gates, and at a lower interface between the high-K gate dielectric layer and the interfacial oxide layer, electric dipoles are generated by interfacial reaction at the lower interface, so as to realize adjusting of the effective work functions of the metal gates, wherein the dopant ions are non-metal ions.

2. The method for manufacturing the semiconductor device according to claim 1, further comprising cleaning the surface of the semiconductor substrate between the step of defining the active region and the step of forming the interfacial oxide layer.

3. The method for manufacturing the semiconductor device according to claim 2, wherein the cleaning the surface of the semiconductor substrate comprises:

ultrasonic-cleaning the semiconductor substrate in deionized water;

immersing the semiconductor substrate in mixed solution including hydrofluoric acid, isopropanol and water;

washing the semiconductor substrate with the deionized water; and spin-drying the semiconductor substrate.

4. The method for manufacturing the semiconductor device according to claim 3, wherein the hydrofluoric acid, isopropanol and water in the mixed solution have a volume ratio of about 0.2-1.5%:0.01-0.10%:1.

5. The method for manufacturing the semiconductor device according to claim 3, wherein the time for immersing the semiconductor substrate in mixed solution is about 2-10 minutes.

6. The method for manufacturing the semiconductor device according to claim 1, further comprising post-deposition-annealing of the high-K gate dielectric layer between the step of forming the high-K gate dielectric layer and the step of forming the metal gate layer, so as to improve quality of the high-K dielectric layer.

7. The method for manufacturing the semiconductor device according to claim 1, wherein the high-K gate dielectric layer comprises any one selected from a group consisting of $ZrO_2$, ZrON, ZrSiON, HfZrO, HfZrOn, HfON, $HfO_2$, HfAlO, HfAlON, HfSiO, HfSiON, HfLaO, HfLaON, and any combination thereof.

8. The method for manufacturing the semiconductor device according to claim 1, wherein the high-K gate dielectric layer is formed by atomic layer deposition, physical vapor deposition, or metal organic chemical vapor deposition.

9. The method for manufacturing the semiconductor device according to claim 1, wherein the high-K gate dielectric layer has a thickness of about 1.5-5 nm.

10. The method for manufacturing the semiconductor device according to claim 1, wherein the metal gate layer comprises any one selected from a group consisting of TiN, TaN, MoN, WN, TaC, and TaCN.

11. The method for manufacturing the semiconductor device according to claim 1, wherein the metal gate layer has a thickness of about 2-30 nm.

12. The method for manufacturing the semiconductor device according to claim 1, wherein in the step of implanting the dopant ions in the metal gate layer, energy and dosage of the ion implantation are controlled so that the implanted dopant ions are only distributed in the metal gate layer, and the energy and the dosage of the ion implantation are also controlled according to a desired threshold voltage.

13. The method for manufacturing the semiconductor device according to claim 12, wherein the energy of the ion implantation is 0.2 KeV-30 KeV.

14. The method for manufacturing the semiconductor device according to claim 13, wherein the dosage of the ion implantation is $(1E13\text{-}1E15)\ cm^{-2}$.

15. The method for manufacturing the semiconductor device according to claim 1, wherein the two opposite types of MOSFETs comprise an NMOSFET and a PMOSFET, and wherein the step of implanting the dopant ions in the metal gate layer comprises:

performing ion implantation in the metal gate layer in the active region of the NMOSFET using a first dopant with the active region of the PMOSFET being covered; and performing ion implantation in the metal gate layer in the active region of the PMOSFET using a second dopant with the active region of the NMOSFET being covered.

16. The method for manufacturing the semiconductor device according to claim 15, wherein the first dopant is capable of decreasing effective work function.

17. The method for manufacturing the semiconductor device according to claim 16, wherein the first dopant is any one selected from a group consisting of P, and As.

18. The method for manufacturing the semiconductor device according to claim 15, wherein the second dopant is capable of increasing effective work function.

19. The method for manufacturing the semiconductor device according to claim 18, wherein the second dopant is any one selected from a group consisting of B, and $BF_2$.

20. The method for manufacturing the semiconductor device according to claim 1, wherein the activation annealing is performed at a temperature of about 950-1000° C. for about 2 ms-30 s.

21. The method for manufacturing the semiconductor device according to claim 1, wherein the activation annealing is any one selected from rapid thermal annealing, spike annealing, laser annealing and microwave annealing.

* * * * *